(12) United States Patent
Chiba et al.

(10) Patent No.: US 9,530,610 B2
(45) Date of Patent: Dec. 27, 2016

(54) BLANKING APERTURE ARRAY DEVICE FOR MULTI-BEAMS, AND FABRICATION METHOD OF BLANKING APERTURE ARRAY DEVICE FOR MULTI-BEAMS

(71) Applicants: NuFlare Technology, Inc., Yokohama-shi (JP); NTT Advanced Technology Corporation, Kawasaki-shi (JP)

(72) Inventors: Kazuhiro Chiba, Sagamihara (JP); Hiroshi Matsumoto, Yokohama (JP); Munehiro Ogasawara, Hiratsuka (JP); Ryoichi Yoshikawa, Kawasaki (JP); Hirofumi Morita, Setagaya-ku (JP); Hirokazu Yamada, Mishima (JP); Teruaki Safu, Atsugi (JP); Toshifumi Konishi, Machida (JP); Takaaki Matsushima, Atsugi (JP); Kazuhisa Kudo, Atsugi (JP); Masaki Yano, Atsugi (JP); Katsuyuki Machida, Atsugi (JP)

(73) Assignees: NuFlare Technology, Inc., Yokohama-shi (JP); NTT Advanced Technology Corporation, Kawasaki-shi (JP)

( * ) Notice: Subject to any disclaimer, the term of this patent is extended or adjusted under 35 U.S.C. 154(b) by 0 days.

(21) Appl. No.: 14/953,959

(22) Filed: Nov. 30, 2015

(65) Prior Publication Data
US 2016/0155600 A1 Jun. 2, 2016

(30) Foreign Application Priority Data
Dec. 2, 2014 (JP) .................................. 2014-244000

(51) Int. Cl.
*H01J 37/04* (2006.01)
*H01J 37/09* (2006.01)
*G03F 1/20* (2012.01)

(52) U.S. Cl.
CPC ........ H01J 37/045 (2013.01); *H01J 2237/043* (2013.01); *H01J 2237/303* (2013.01); *H01J 2237/31715* (2013.01)

(58) Field of Classification Search
CPC ...... H01J 37/045; H01J 37/3177; H01J 37/09; H01J 37/1477; H01J 37/153; H01J 37/127; G03F 1/20; G03F 7/2059
(Continued)

(56) References Cited

U.S. PATENT DOCUMENTS

| | | | | |
|---|---|---|---|---|
| 5,214,289 A | * | 5/1993 | Betsui | H01J 37/045 250/396 R |
| 5,363,021 A | * | 11/1994 | MacDonald | H01J 3/022 250/396 R |

(Continued)

FOREIGN PATENT DOCUMENTS

| | | |
|---|---|---|
| JP | 2005-136114 | 5/2005 |
| JP | 2010-177667 | 8/2010 |

(Continued)

OTHER PUBLICATIONS

U.S. Appl. No. 14/828,681, filed Aug. 18, 2015, Hiroshi Matsumoto, et al.

*Primary Examiner* — David A Vanore
(74) *Attorney, Agent, or Firm* — Oblon, McClelland, Maier & Neustadt, L.L.P.

(57) ABSTRACT

A method for fabricating a blanking aperture array device for multi-beams includes forming, using a substrate over which a first insulating film, a first metal film, a second insulating film, and a second metal film are laminated in order, electrodes and pads on the second metal film, remov- (Continued)

ing a part of the second metal film, removing the second insulating film using, as a mask, the electrodes, the pads, and a remaining part of the second metal film, and forming openings each being between a pair of electrodes, wherein, a part of the second metal film is etched such that some part of it remains in regions each connecting one of the electrodes and one of the pads, and a region in which entire openings are formed except the openings themselves is configured by the electrodes, pads, and first and second metal films such that the insulating film is not exposed.

3 Claims, 7 Drawing Sheets

(58) Field of Classification Search
USPC .................. 250/396 R, 398, 492.2, 492.22, 492.23,250/492.3, 492.1, 396 ML, 491.1
See application file for complete search history.

(56) References Cited

U.S. PATENT DOCUMENTS

| | | | | |
|---|---|---|---|---|
| 5,369,282 A * | 11/1994 | Arai | ................. | B82Y 10/00 250/398 |
| 6,166,387 A * | 12/2000 | Muraki | ................. | B82Y 10/00 250/492.2 |
| 6,291,940 B1 * | 9/2001 | Scholte Van Mast | | H01J 37/045 250/492.23 |
| 7,795,597 B2 * | 9/2010 | Nagae | ................. | B82Y 10/00 250/396 R |
| 8,198,601 B2 * | 6/2012 | Platzgummer | ........ | H01J 37/045 250/396 R |
| 8,278,635 B2 * | 10/2012 | Platzgummer | ........ | B82Y 10/00 250/396 R |
| 8,563,942 B2 * | 10/2013 | Platzgummer | ........ | B82Y 10/00 250/396 R |
| 8,987,677 B2 * | 3/2015 | Wieland | ................. | B82Y 10/00 250/396 ML |
| 9,053,906 B2 * | 6/2015 | Platzgummer | ...... | H01J 37/3026 |
| 9,099,277 B2 * | 8/2015 | Platzgummer | ........ | H01J 37/045 |
| 9,330,881 B2 * | 5/2016 | Matsumoto | ........... | H01J 37/045 |
| 9,373,482 B2 * | 6/2016 | Platzgummer | ...... | H01J 37/3026 |
| 2008/0203317 A1 * | 8/2008 | Platzgummer | ........ | B82Y 10/00 250/396 R |
| 2010/0187434 A1 | 7/2010 | Platzgummer et al. | | |
| 2010/0288938 A1 * | 11/2010 | Platzgummer | ........ | B82Y 10/00 250/396 R |
| 2016/0064178 A1 | 3/2016 | Matsumoto | | |

FOREIGN PATENT DOCUMENTS

| | | |
|---|---|---|
| JP | 2010-267962 | 11/2010 |
| JP | 2014-177560 | 9/2014 |
| JP | 2016-54285 A | 4/2016 |

\* cited by examiner

BLANKING APERTURE ARRAY DEVICE FOR MULTI-BEAMS, AND FABRICATION METHOD OF BLANKING APERTURE ARRAY DEVICE FOR MULTI-BEAMS

CROSS-REFERENCE TO RELATED APPLICATION

This application is based upon and claims the benefit of priority from the prior Japanese Patent Application No. 2014-244000 filed on Dec. 2, 2014 in Japan, the entire contents of which are incorporated herein by reference.

BACKGROUND OF THE INVENTION

Field of the Invention

Embodiments of the present invention relate generally to a blanking aperture array device for multi-beams, and to a method for fabricating a blanking aperture array device for multi-beams.

Description of Related Art

In recent years, with high integration of LSI, the line width (critical dimension) required for semiconductor device circuits progressively narrows year by year. In fabricating a mask used in a lithography technique which forms such a circuit, an electron beam writing technique having high resolution is employed.

As a writing apparatus that performs electron beam writing, a writing apparatus using multi-beams can be cited. Compared with the case of writing a pattern with a single electron beam, since in multi-beam writing it is possible to irradiate multiple beams at a time, the throughput can be greatly increased. For example, in a writing apparatus employing a multi-beam system, multi-beams are formed by letting portions of an electron beam emitted from an electron gun pass through a corresponding hole of a plurality of holes formed in the mask, and the multi-beams are made to pass through respective blanking aperture devices to be individually blanking-controlled. In that case, each deflected beam is blocked (blanking) by a blocking member, and each undeflected beam irradiates a target object or "sample". At this time, blanking control is performed for each beam by a deflection means other than the blanking aperture array device so as to irradiate a desired position on the target object.

In the blanking aperture array device for performing blanking control of multi-beams, there are formed a plurality of passage holes for multi-beams, wherein a pair of electrodes for deflecting a beam is formed at the circumference of each of the passage holes. For the blanking aperture array device, a manufacturing method of forming each passage hole, each electrode pair, etc. in/on a silicon (Si) substrate by using a semiconductor manufacturing technique is employed.

If a protection insulating film is exposed on the surface of a fabricated blanking aperture array device, the exposed insulator on the surface is charged (electrified) due to irradiation of beams emitted by the writing apparatus incorporating the blanking aperture array device. Therefore, there is a problem that beam distortion or blur occurs because of the electrostatic charge. Thus, antistatic measures need to be taken for the blanking aperture array device. For example, electrodes of the pair are formed to be at opposite sides of the passage hole formed in the Si substrate in a manner such that the side wall of the passage hole is incorporated in the electrode pair, and a metal wiring from each electrode is formed on the substrate. Regarding the metal wiring, there is disclosed a structure in which a metal film is applied, through an insulating film, on the metal wiring so that electric potential of the wiring may not affect the beam deflection (e.g., refer to Japanese Patent Application Laid-open (JP-A) No. 2005-136114). Besides, there is disclosed a structure of a blanking aperture array device in which an insulating film is exposed over the electrode region of the substrate body, and an electrode having been fabricated as another substrate is bonded to the substrate body where the surface of the insulating film is covered with a metal film (e.g., refer to Japanese Patent Application Laid-open (JP-A) No. 2010-267962). However, in whichever of the above structures, since there remains an insulator on the upper surface of the blanking aperture array device, it is impossible to perfectly inhibit electrostatic charge of the insulator at the time of beam irradiation. Moreover, it is difficult to sufficiently achieve the charge inhibiting effect in the structure where an Si (semiconductor) substrate is exposed intact in the region other than the electrodes, wiring points, etc. Further, in the case of forming an electrode on the side wall of the passage hole, or bonding an electrode fabricated as another substrate, it makes the fabrication of the blanking aperture array device complicated.

BRIEF SUMMARY OF THE INVENTION

According to one aspect of the present invention, a method for fabricating a blanking aperture array device for multi-beams includes forming, using a substrate over which a first insulating film, a first metal film, a second insulating film, and a second metal film are laminated in order from a lower side, a plurality of electrodes and a plurality of pads on the second metal film, removing a part of the second metal film by etching, removing the second insulating film by etching using, as a mask, the plurality of electrodes, the plurality of pads, and a remaining part of the second metal film, and forming a plurality of openings, each of which is in a position between a pair of electrodes in the plurality of electrodes, and is penetrating the substrate, wherein, when removing the part of the second metal film by etching, the second metal film is etched such that some part of the second metal film remains in a plurality of regions each connecting one of the plurality of electrodes and one of the plurality of pads, and when viewed from above the substrate, a region in which a whole of the plurality of openings having been formed except the plurality of openings themselves is configured by the plurality of electrodes, the plurality of pads, the first metal film, and the second metal film such that an insulating film is not exposed.

According to another aspect of the present invention, a blanking aperture array device for multi-beams includes a substrate where a plurality of openings are formed, a first metal film formed in a region, over an upper surface of the substrate, in which a whole of the plurality of openings are formed except the plurality of openings themselves, a plurality of first electrodes, made of metal material and formed on the first metal film, each of which is close to a corresponding one of the plurality of openings, a plurality of second electrodes, made of metal material and formed on the first metal film, each of which is arranged at an opposite side of a corresponding one of the plurality of openings with respect to each of the plurality of first electrodes, and a plurality of wiring lines, made of metal material and formed on the first metal film, each of which is connected to either one of the plurality of first electrodes and the plurality of second electrodes, wherein the region in which the whole of the plurality of openings are formed except the plurality of openings themselves, over the upper surface of the substrate, and which faces a direction of irradiation of multi-charged particle beams, is covered with the first metal film, the plurality of first electrodes, the plurality of second electrodes, and the plurality of wiring lines.

DETAILED DESCRIPTION OF THE INVENTION

First Embodiment

In a first embodiment of the present invention, there is described a method of fabricating, by a simpler process, a blanking aperture array device that can inhibit surface electrostatic charge generated by multi-beam irradiation.

Figure 1:
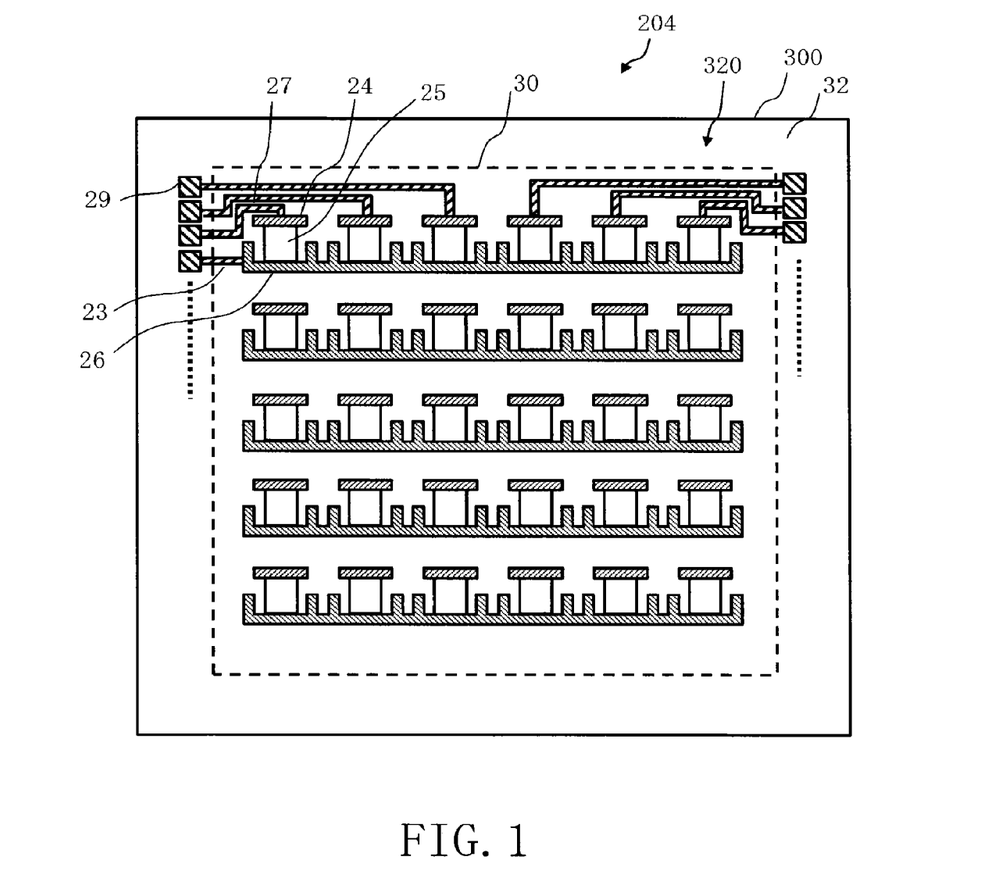
FIG. 1 is a top view showing a configuration of a blanking aperture array device for multi-beams according to a first embodiment.

FIG. 1 is a top view showing a configuration of a blanking aperture array device for multi-beams according to the first embodiment. In FIG. 1, a blanking aperture array device 204 is formed by processing a substrate 300, which is made of silicon (Si), for example, by using semiconductor manufacturing technique. The central part of the substrate 300 is shaved from the back side and processed to be a membrane region 30 having a thin film thickness h. The circumference surrounding the membrane region 30 is a circumference region 32 having a thick film thickness H. The upper surface of the membrane region 30 and the upper surface of the circumference region 32 are formed to be at the same height position, or substantially at the same height position.

In the membrane region 30, passage holes 25 (plurality of openings/multiple openings) through each of which each beam of multi-beams passes are formed. In other words, in the substrate 300, a plurality of penetrating passage holes 25 through each of which a corresponding one of multi-beams passes are formed in a two-dimensional array of m rows long (y direction) and n columns wide (x direction) (m≥2, n≥2). A plurality of pairs of electrodes 24 and 26 at opposite sides of a corresponding one of a plurality of passage holes 25 are arranged in the membrane region 30. In the example of FIG. 1, passage holes 25 of five rows long (length: y direction) and six columns wide (width: x direction) are arrayed. Each of the electrodes 24 is arranged for each passage hole 25, and one electrode 26 is arranged to be common to passage holes 25 in one row. Moreover, a plurality of pads 29 for transmitting signals (deflection potential or ground potential) from the outside to a plurality of electrodes 24 and 26 are arranged in the circumference region 32 which surrounds the quadrangular membrane region 30. Wiring lines 23 and 27, connecting each pad 29 to a corresponding electrode (electrode 24 or 26) and being exposed to the surface, are pattern-formed on the substrate 300. The electrode 24 is connected to a corresponding pad 29 by the wiring line 27. The electrode 26 is connected to a corresponding pad 29 by the wiring line 23. An individual blanking device which performs blanking deflection of one beam of multi-beams is configured by the electrode 24, the electrode 26 opposite to the electrode 24, the pad 29 corresponding to the electrode 24, the wiring line 27 connecting the electrode 24 and the corresponding pad 29, the pad 29 corresponding to the electrode 26, the wiring line 23 connecting the electrode 26 and the corresponding pad 29. Although, in the example of FIG. 1, a plurality of pads 29 are arranged along the two sides of the four sides of the quadrangular membrane region 30, it is not limited thereto. It is also preferable to be arranged along the four sides.

Metal is used as material of the electrodes 24 and 26, the pads 29, and the wiring lines 23 and 27. The upper surface of the blanking aperture array device 204, other than the electrodes 24 and 26, the pads 29, the wiring lines 23 and 27, and the passage holes 25, is covered with a metal film 320 (first metal film). Therefore, regarding the blanking aperture array device 204 according to the first embodiment, when viewed from above the substrate, the region in which the whole of a plurality of passage holes 25 (openings) are formed except the plurality of passage holes 25 themselves is configured by a plurality of electrodes 24 and 26, a plurality of pads 29, the wiring lines 23 and 27 (second metal film), and the metal film 320 (first metal film) such that insulating films are not exposed. Although, in the example of FIG. 1, the whole upper surface of the blanking aperture array device 204 is covered with the metal film, it is not limited thereto. What is necessary is that the region including the membrane region 30 and its peripheral region surrounding a plurality of pads 29 is covered with the metal film. As described above, since the insulator is not exposed when viewed from above the substrate, it is possible to inhibit an electrostatic charge (charge-up) of the blanking aperture array device 204 mounted on the writing apparatus at the time of beam irradiation.

Figure 2:
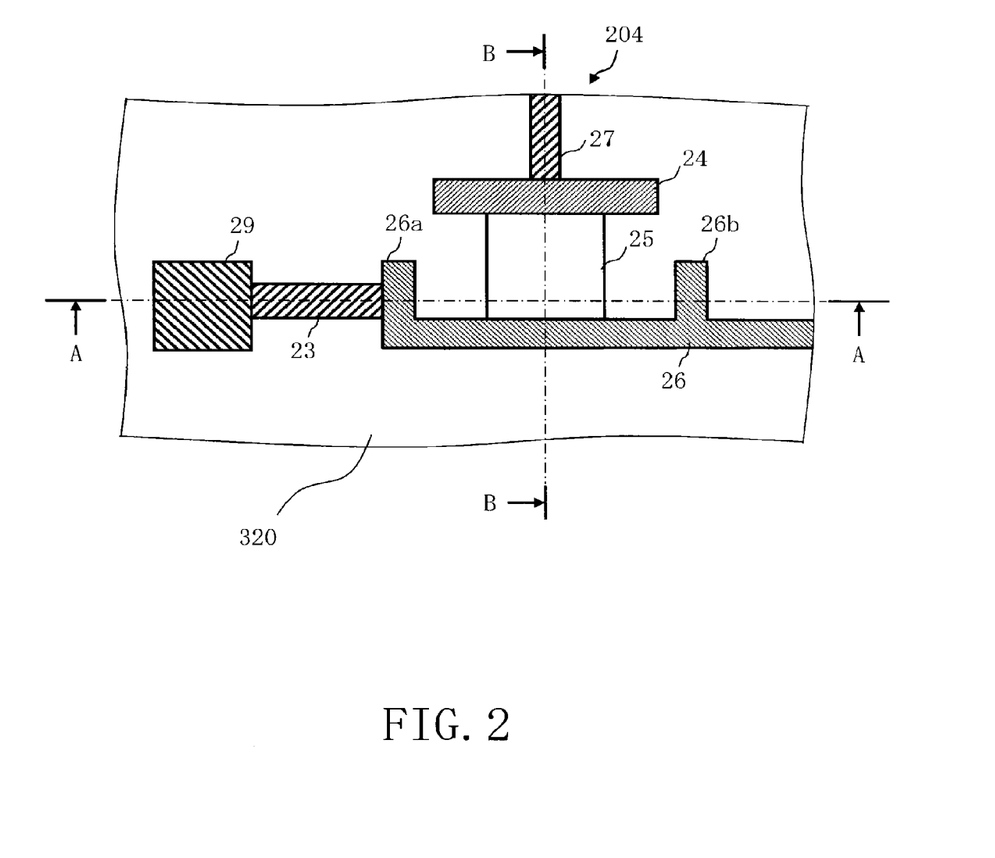
FIG. 2 is a top view showing a structure of a partial region in a membrane region of a blanking aperture array device according to the first embodiment.

FIG. 2 is a top view showing a structure of a partial region in the membrane region of the blanking aperture array device according to the first embodiment. In FIG. 2, there are shown the passage hole 25 being one of a plurality of passage holes 25 in the first column from the left, the electrodes 24 and 26 arranged close to the passage hole 25 concerned, the wiring lines 23 and 27, and the pad 29, for example. The electrode 26 extends along one side of the passage hole 25, wherein the side is opposite to the electrode 24, and convex portions (26a, 26b) of the electrode 26 are formed in such a manner that they are projected along two sides of the passage hole 25, in the direction orthogonal to the extending direction, to be long in the middle of the sides. The electrode 26 is connected to the corresponding pad 29 through the wiring line 23. The electrode 24 is connected to the corresponding pad 29 (not shown) through the wiring line 27.

Figure 3:
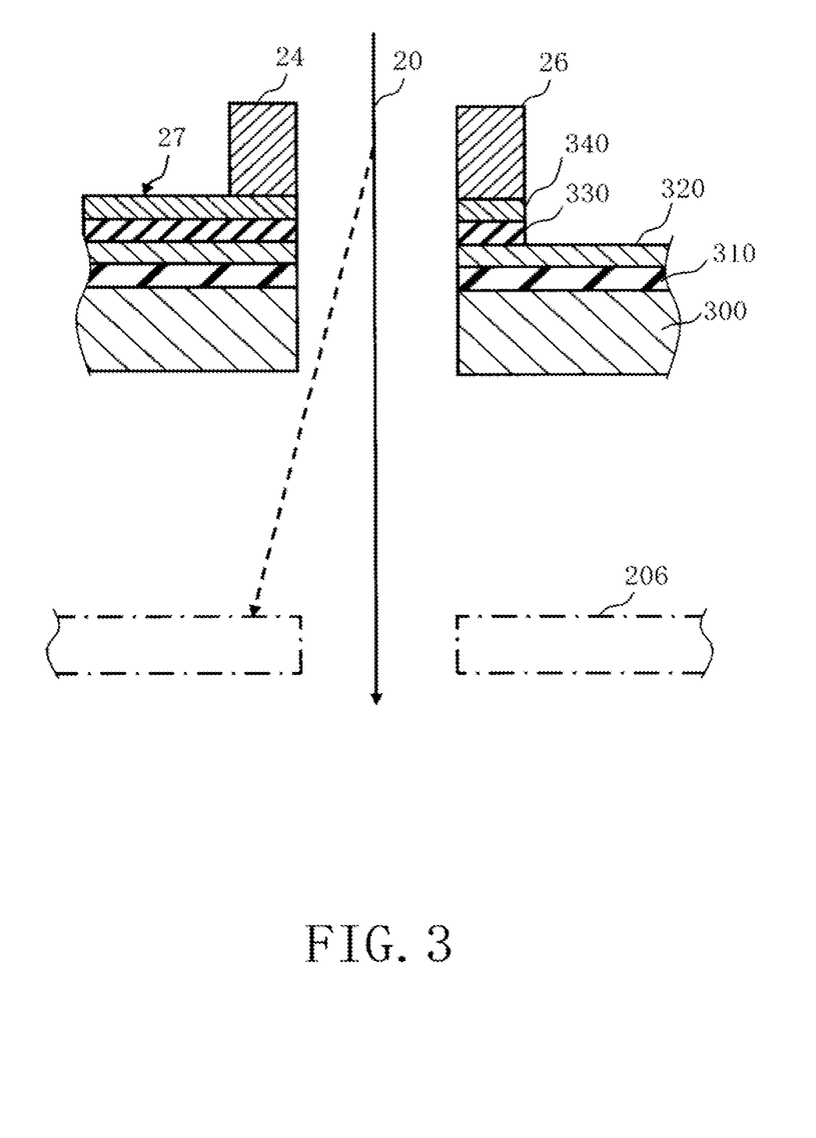
FIG. 3 is a sectional view showing a partial structure of a blanking aperture array device for illustrating a blanking control according to the first embodiment.

FIG. 3 is a sectional view showing a partial structure of a blanking aperture array device for illustrating a blanking control according to the first embodiment. FIG. 3 is a B-B sectional view of FIG. 2. When writing processing is performed by the multi-beam writing apparatus (not shown) in which the aperture array device 204 is mounted, each beam of multi-beams formed at the upstream side of the aperture array device 204 passes through a corresponding one of a plurality of passage holes 25 of the aperture array device 204. In other words, each beam passes through the passage hole 25 which is different from others. The passage hole 25 is formed at the position where a corresponding beam of multi-beams passes. At the downstream side of the aperture array device 204, a limiting aperture member 206 in which a single opening is formed at the center, for example, is arranged.

For example, the electrode 26 is always (irrespective of the writing processing condition) applied with a ground potential through the pad 29 (not shown) connected by the wiring line 27 (not shown). On the other hand, when the beam is ON, the electrode 24 is applied with a ground potential through the pad 29 (not shown) connected by the wiring line 27. However, when the beam is OFF, the electrode 24 is applied with a positive deflection potential for performing blanking deflection of an electron beam passing through a corresponding passage hole 25, through the pad 29 (not shown) connected by the wiring line 27. When the beam is ON, since no potential difference occurs between the electrodes 24 and 26, the beam passes without being deflected and passes through the opening of the limiting aperture 206. When the beam is OFF, a passing beam 20 is deflected by a potential difference between the positive deflection potential of the electrode 24 and the ground potential of the electrode 26, and deviated from the opening of the limiting aperture member 206 to be blocked by the limiting aperture member 206. This operation is individually performed by a corresponding individual blanking device for each beam of multi-beams.

As shown in FIG. 3, on the substrate 300, an insulating film 310 (first insulating film) and a metal film 320 (first metal film) are laminated in order from the lower side. Further, on the metal film 320, an insulating film 330 (second insulating film), a metal film 340 (second metal film), and the electrode 26 are laminated. It is formed such that the position of the edge face at the side of the passage hole 25 is the same for the insulating film 330, the metal film 340, and the electrode 26. Similarly, it is formed such that the position of the edge face on the side opposite to the passage hole 25 is also the same for the insulating film 330, the metal film 340, and the electrode 26. Furthermore, it is formed such that the position of the edge face at the side of the passage hole 25 is the same for the insulating film 330, the metal film 340, and the electrode 24. Moreover, the wiring line 27 is formed by the metal film 340, on the opposite side of the electrode 24 to the passage hole 25.

Figure 4:
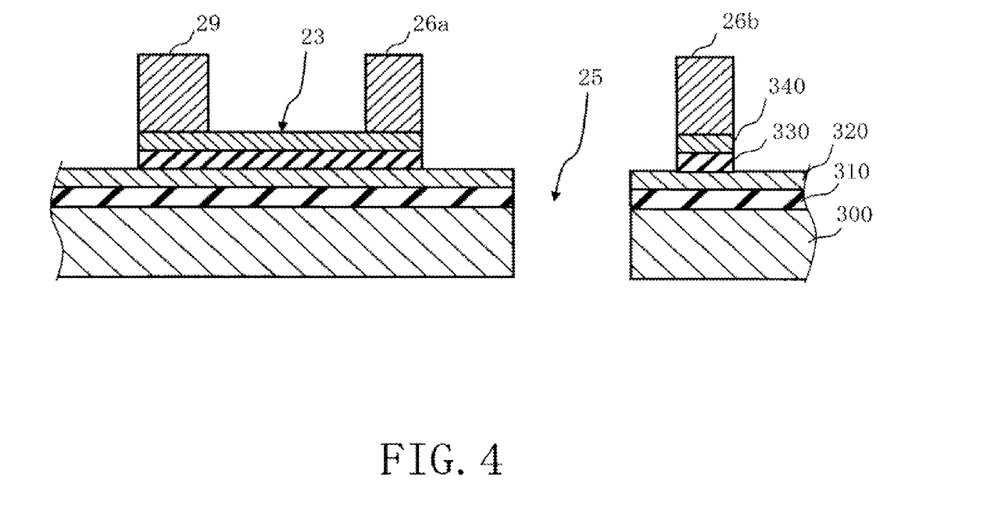
FIG. 4 is another sectional view showing a partial structure of a blanking aperture array device for illustrating a blanking control according to the first embodiment.

FIG. 4 is another sectional view showing a partial structure of a blanking aperture array device for illustrating a blanking control according to the first embodiment. FIG. 4 is an A-A sectional view of FIG. 2. As shown in FIG. 4, on the substrate 300, the insulating film 310 (first insulating film) and the metal film 320 (first metal film) are laminated in order from the lower side. Further, on the metal film 320, the insulating film 330 (second insulating film), the metal film 340 (second metal film), and the electrode 26 (26*a*, 26*b*) are laminated. It is formed such that the position of the edge face at the side of the passage hole 25 is the same for the insulating film 330, the metal film 340, and the electrode 26*b*. Similarly, it is formed such that the position of the edge face on the side opposite to the passage hole 25 is also the same for the insulating film 330, the metal film 340, and the electrode 26*b*. Furthermore, it is formed such that the position of the edge face at the side of the passage hole 25 is the same for the insulating film 330, the metal film 340, and the electrode 26*a*. Moreover, the wiring line 23 is formed by the metal film 340, on the opposite side of the electrode 26*a* to the passage hole 25.

As shown in FIGS. 3 and 4, when viewed from above the substrate, the whole surface is covered with the metal film by a plurality of electrodes 24 and 26, pads 29, metal films 23 and 27 being wiring lines, and the metal film 320 covering the surface other than described above. That is, when viewed from above the substrate, the substrate 300 of Si material and the insulating films 310 and 330 are not exposed anywhere. By virtue of this configuration, an electrostatic charge can be inhibited. Now, with reference to the A-A sectional view shown in FIG. 4 as an example, a method for fabricating the blanking aperture array device according to the first embodiment is described below.

FIGS. 5A to 5D are sectional views showing steps of a fabrication method of a blanking aperture array device according to the first embodiment. FIGS. 5A to 5D show the steps from an opening forming step to an insulating film etching step (1). Subsequent steps will be described later.

Figure 5A:
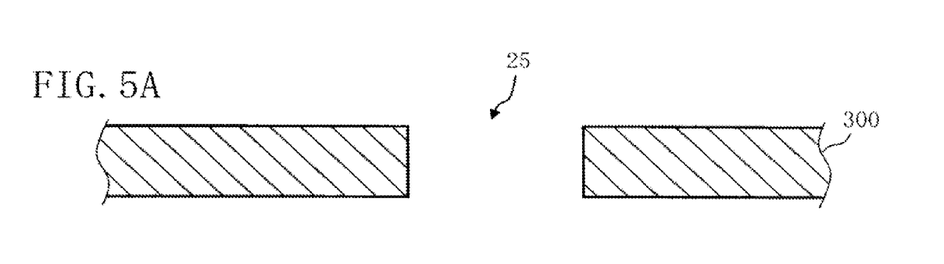
FIGS. 5A to 5D are sectional views showing steps of a fabrication method of a blanking aperture array device according to the first embodiment.

In the opening forming step, as shown in FIG. 5A, the passage hole 25 (opening) is formed in the substrate 300. Although one passage hole 25 is here shown, it goes without saying that a plurality of passage holes 25 are formed in the substrate 300. As described above, an Si substrate is preferably used as the substrate 300. Moreover, as described above, the central part of the substrate 300 is shaved from the back side and processed to be the membrane region 30 having the thin film thickness h. A plurality of passage holes 25 through each of which a corresponding one of multi-beams passes are formed in a two-dimensional array of m rows long (y direction) and n columns wide (x direction) (m≥2, n≥2). The forming method is to form a resist pattern, in which regions for the passage holes 25 are open, on the Si substrate 300 by the lithography technique (not shown). Then, using the resist pattern as a mask, a though-hole is formed by a RIE (reactive ion etching) method using plasma.

Figure 5B:
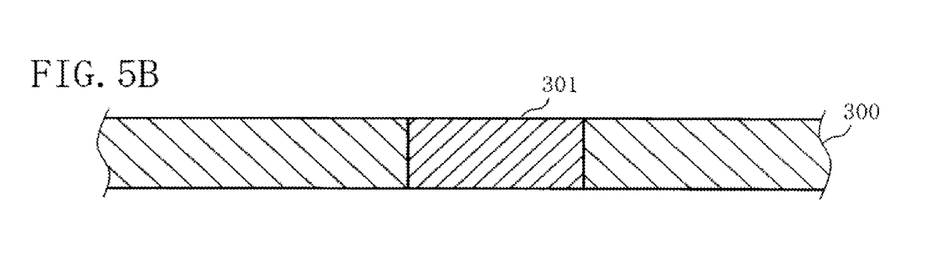

In the opening-filling step, as shown in FIG. 5B, the passage hole 25 is filled up with a filling film 301. An organic resin film is preferably used, for example, as the filling film 301. As the forming method, a spin-on method can be used. The surplus filling film 301 overflowing out of the passage hole 25 onto the substrate 300 is removed.

Figure 5C:
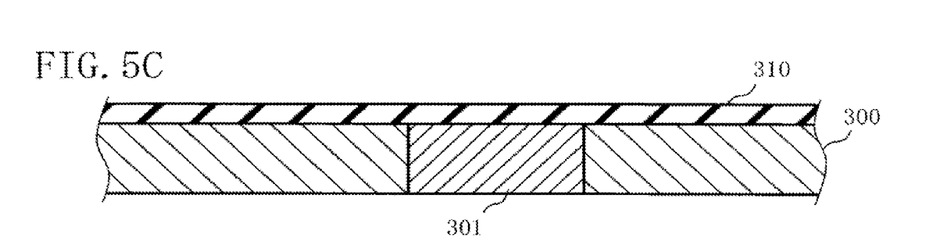

In the insulating film forming step (1), as shown in FIG. 5C, the insulating film 310 (first insulating film) is formed on the substrate 300 where the passage hole 25 has been filled up with the filling film 301. For example, a silicon oxide ($SiO_2$) film having a thickness of 0.5 μm is formed by a plasma CVD (chemical vapor deposition) method. The film forming rate is 80 μm/min, for example. The forming method is not limited to the CVD method, and other method may also be used. For example, a sputtering method may be used.

Figure 5D:
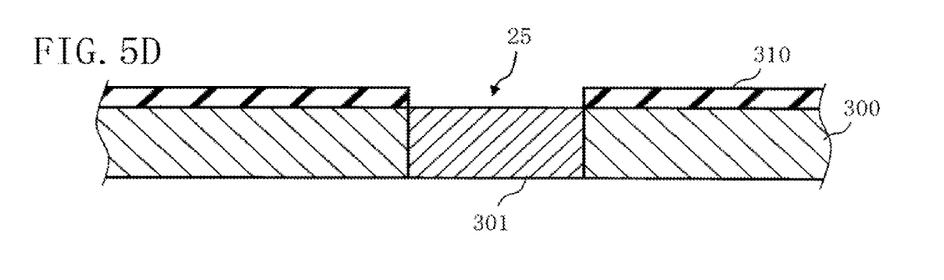

In the insulating film etching step (1), as shown in FIG. 5D, the insulating film 310 formed on the passage hole 25 is removed by etching. First, a resist pattern in which the region of the passage hole 25 is open is formed using a lithography technique (not shown). Then, using the resist pattern as a mask, etching removal is performed on the exposed insulating film 310 by an RIE method using plasma. Instead of the dry etching method (RIE method), a wet etching method using a hydrofluoric acid aqueous solution may also be used. After the etching, the resist pattern is removed by ashing, etc.

FIGS. 6A to 6D are sectional views showing steps of a fabrication method of a blanking aperture array device according to the first embodiment. FIGS. 6A to 6D show the steps from a metal film forming step to an insulating film etching step. Subsequent steps will be described later.

Figure 6A:
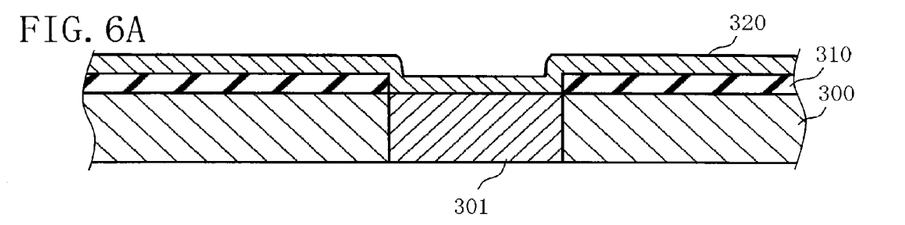
FIGS. 6A to 6D are sectional views showing steps of a fabrication method of a blanking aperture array device according to the first embodiment.

In the metal film forming step (1), as shown in FIG. 6A, the metal film 320 (first metal film) is formed on the insulating film 310 and the filling film 301 in the passage hole 25. As the metal film 320, a titanium (Ti) film having a thickness of 0.02 μm is formed, and then, a gold (Au) film having a thickness of 0.07 μm is formed, for example. For forming the metal film 320, a vapor deposition method is used, and the film forming rate of the Ti film is 40 nm/min and that of the Au film is 30 nm/min. However, the forming method is not limited to the vapor deposition method, and other method may also be used. Although the laminated film is shown, it is not limited thereto. For example, a single layer Au film can be used, or a single layer platinum (Pt) film can also be used. When using a laminated film, a metal film such as a chromium (Cr) film may be used instead of the Ti film.

Figure 6B:
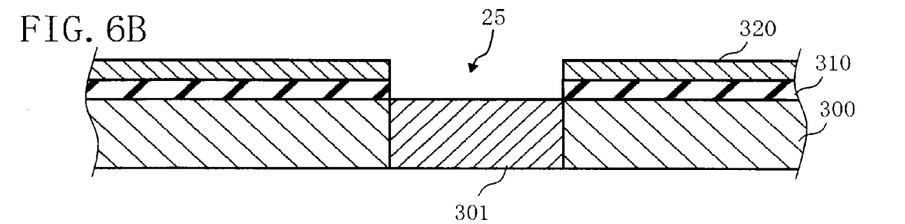

In the metal film etching step (1), as shown in FIG. 6B, the metal film 320 formed on the passage hole 25 is removed by etching. First, a resist pattern in which the region of the passage hole 25 is open is formed using the lithography technique (not shown). Then, using the resist pattern as a mask, etching removal is performed on the exposed metal film 320 by a wet etching method. For example, a hydrofluoric acid aqueous solution can be used for etching the Ti film. The etching rate is 400 nm/min, for example. A mixed aqueous solution of hydrochloric acid and nitric acid can be used for etching the Au film. The etching rate is 85 nm/min. After the etching, the resist pattern is removed by ashing, etc.

Figure 6C:
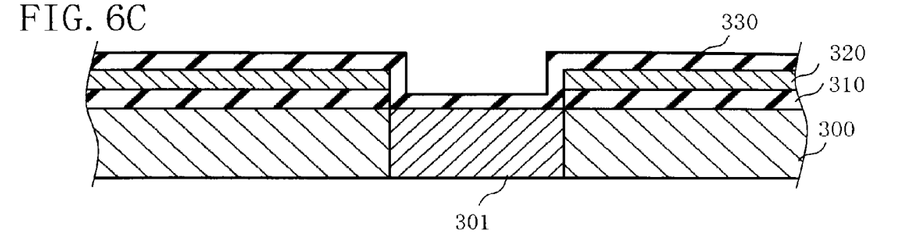

In the insulating film forming step (2), as shown in FIG. 6C, the insulating film 330 (second insulating film) is formed on the metal film 320 and the filling film 301 in the passage hole 25. For example, a silicon oxide ($SiO_2$) film having a thickness of 0.5 μm is formed by a plasma CVD (chemical vapor deposition) method. The film forming rate is 80 μm/min, for example. The forming method is not limited to the CVD method, and other method may also be used. For example, a sputtering method may be used.

Figure 6D:
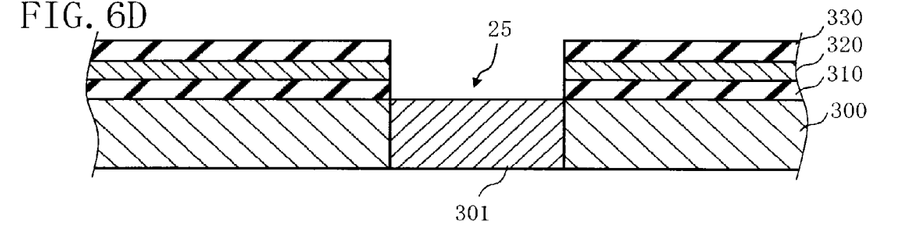

In the insulating film etching step (2), as shown in FIG. 6D, the insulating film 330 formed on the passage hole 25 is removed by etching. First, a resist pattern in which the region of the passage hole 25 is open is formed using a lithography technique (not shown). Then, using the resist pattern as a mask, etching removal is performed on the exposed insulating film 330 by an RIE method using plasma. Instead of the dry etching method (RIE method), a wet etching method using a hydrofluoric acid aqueous solution may also be used. After the etching, the resist pattern is removed by ashing, etc.

FIGS. 7A to 7D are sectional views showing steps of a fabrication method of a blanking aperture array device according to the first embodiment. FIGS. 7A to 7D show the steps from a metal film forming step (2) to an insulating film etching step (3).

Figure 7A:
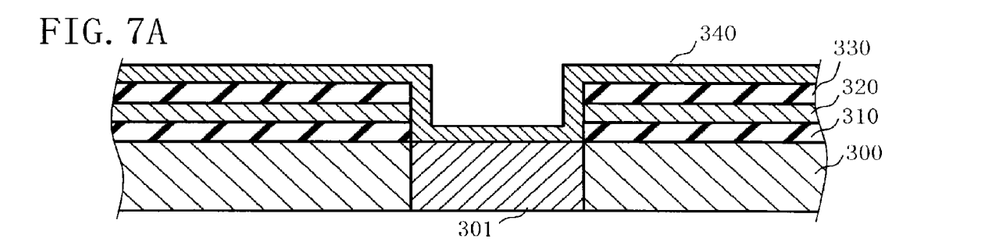
FIGS. 7A to 7D are sectional views showing steps of a fabrication method of a blanking aperture array device according to the first embodiment.

In the metal film forming step (2), as shown in FIG. 7A, the metal film 340 (second metal film) is formed on the insulating film 330 and the filling film 301 in the passage hole 25. As the metal film 340, a gold (Au) film having a thickness of 0.07 μm is formed, for example. For forming the metal film 340, the vapor deposition method is used, and the film forming rate is 30 nm/min. The forming method is not limited to the vapor deposition method, and other method may also be used. For example, a sputtering method may be used. Although the Au film is used as the metal film 340, a platinum (Pt) film may also be used. By the process as described above, the substrate 300 is formed, on the surface of which the insulating film 310 (first insulating film), the metal film 320 (first metal film), the insulating film 330 (second insulating film), and the metal film 340 (second metal film) are laminated in order from the lower side. The metal film 340 functions as the wiring lines 23 and 27 described above and as a seed layer in the electrolytic plating method described later.

Figure 7B:
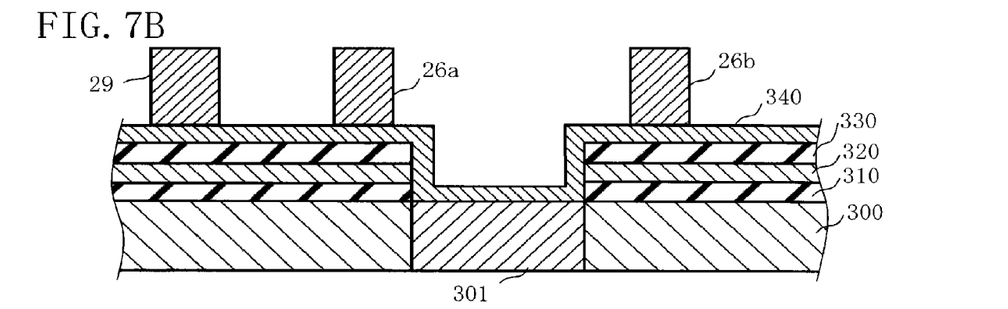

In the metal film forming step (3), as shown in FIG. 7B, using the substrate 300 shown in FIG. 7A, a metal film (third metal film) serving as the electrode 26 (26a, 26b) and the pad 29 is formed on the metal film 340 (second metal film). Although only parts 26a and 26b of one electrode 26 and one pad 29 are here shown, it goes without saying that a plurality of electrodes 24 and 26 and a plurality of pads 29 are formed on the substrate 300. A resist pattern in which the regions of the electrodes 24 and 26 and the pad 29 are open is formed using a lithography technique (not shown). Then, using the resist pattern as a mask and the metal film 340 as a seed layer, a plurality of electrodes 24 and 26 and a plurality of pads 29 are formed by the electrolytic plating method. As a plurality of electrodes 24 and 26 and a plurality of pads 29, an Au film having a thickness of 10 μm is formed, for example. Although the Au film is used as a plurality of electrodes 24 and 26 and a plurality of pads 29, a platinum (Pt) film may also be used. Alternatively, as long as it is metal which can serve as an electrode, other metal, such as copper (Cu) or aluminum (Al) may be used. The film forming rate is 60 nm/min, for example.

Figure 7C:
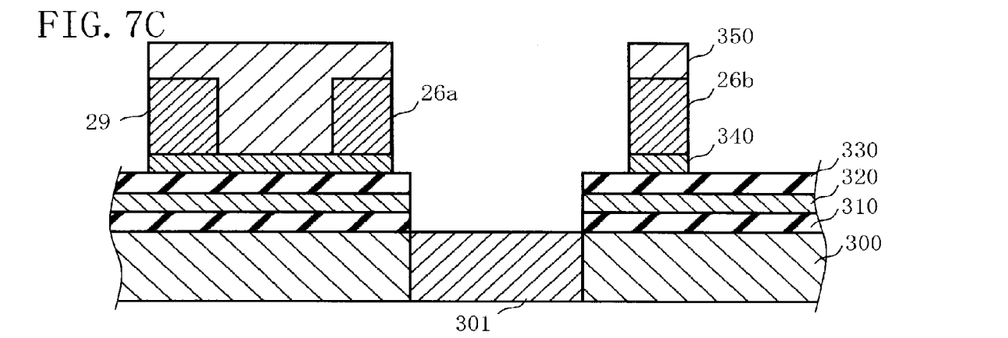

In the metal film etching step (2), as shown in FIG. 7C, some parts of the metal film 340 (second metal film) are removed by etching. When removing some parts of the metal film 340 (second metal film) by etching, it is etched such that some of the metal film 340 remains in the regions individually connecting one of a plurality of electrodes 26 (24) and one of a plurality of pads 29. In other words, the metal film 340 (some part of the metal film 340) is removed by etching other than the wiring regions for forming the wiring lines 23 and 27 and the lower layer regions connecting a plurality of electrodes 24 and 26 and a plurality of pads 29. Using a lithography technique (not shown), a resist pattern 350 is formed in which regions are open other than the wiring regions where the wiring lines 23 and 27 are formed and the lower layer regions connecting a plurality of electrodes 24 and 26 and a plurality of pads 29. Then, using the resist pattern 350 as a mask, etching removal is performed on the exposed metal film 340 by a wet etching method. For example, a mixed aqueous solution of hydrochloric acid and nitric acid can be used for etching the Au film. The etching rate is 85 nm/min, for example. For etching the metal film 340, other aqueous solution is also usable as long as it can be etched. For example, an iodine aqueous solution, etc. can be used. Alternatively, a dry etching method may be used. After the etching, the resist pattern is removed by ashing, etc., or is not removed to remain.

Figure 7D:
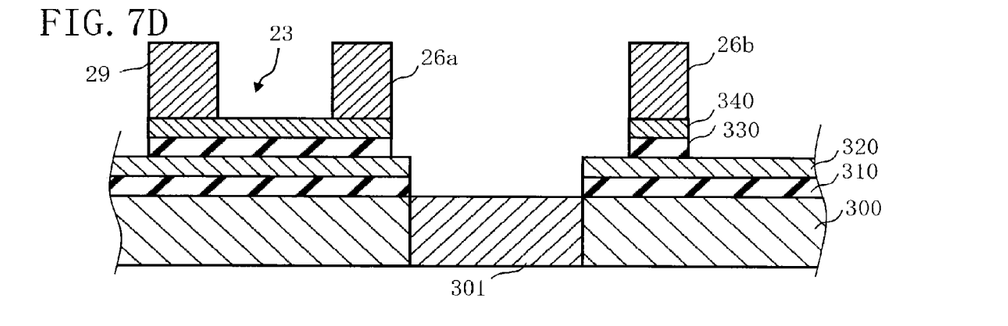

In the insulating film etching step (3), as shown in FIG. 7D, the insulating film 330 is removed by etching using, as a mask, a plurality of electrodes 24 and 26, a plurality of pads 29, and the remaining part of the metal film 340. Then, etching removal is performed on the exposed insulating film 330 by an RIE method using plasma. Instead of the dry etching method (RIE method), a wet etching method using a hydrofluoric acid aqueous solution may also be used. Since a plurality of electrodes 24 and 26, a plurality of pads 29, and the remaining part of the metal film 340 are used as a mask, when viewed from above the substrate, it is possible to prevent the insulating film 330 from being exposed on the surface after the etching. Moreover, an etching residue of the insulating film 330 which may be left because of positional deviation, etc. when forming a resist pattern can be prevented. Furthermore, according to the first embodiment, when removing the insulating film 330 by etching, the metal film 320 is used as an etching stopper. Thereby, an etching residue of the insulating film 330 which is left because of lack of etching progress can be prevented.

Next, in the filling film etching step, a plurality of passage holes 25 (opening) are formed, each of which is in the position between the electrodes being a pair of the electrodes 24 and 26, and is penetrating the substrate 300. Specifically, the filling film 301 material filled in a plurality of passage holes 25 is removed by etching. For example, an RIE method using plasma can be employed. The etching rate is 500 nm/min, for example. By what has been described above, the cross-sectional structure shown in FIG. 4 can be acquired. By forming and etching the insulating films and the metal films described above in the state where the filling film 301 material is filled in the passage hole 25, it is possible to prevent the insulating film or the metal film from adhering to the side wall of the passage hole 25.

Regarding the blanking aperture array device 204 which has been fabricated according to the method described above, when viewed from above the substrate, the region including the whole of a plurality of formed passage holes 25 (openings) is configured by a plurality of electrodes 24 and 26, a plurality of pads 29, and the metal films 320 and 340 such that the insulating film and the substrate 300 are not exposed. In other words, it can be configured such that only metal films are exposed on the surface through which the multi-beams pass. Therefore, even when the blanking aperture array device 204 is mounted in a multi-beam writing apparatus (multi-beam exposure apparatus), charge-up generated during beam irradiation can be suppressed. Moreover, as described above, it is possible to suppress charge-up of the surface of the blanking aperture array device 204 by a simpler process compared with a conventional technique.

As described above, according to the first embodiment, it is possible to fabricate, by a simpler process, a blanking aperture array device capable of suppressing an electrostatic charge of the surface generated by multi-beam irradiation.

Embodiments have been explained referring to concrete examples described above. However, the present invention is not limited to these specific examples. For example, a layer(s) may be formed between the substrate 300 and the insulating film 310 (or the metal film 320).

While the apparatus configuration, control method, and the like not directly necessary for explaining the present invention are not described, some or all of them can be selectively used on a case-by-case basis. For example, although description of a writing apparatus is omitted, it should be understood that necessary configuration can be selected and used appropriately when needed.

In addition, any other blanking aperture array device for multi-beams and fabrication method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a blanking aperture array device for multi-beams comprising:
    forming, using a substrate over which a first insulating film, a first metal film, a second insulating film, and a second metal film are laminated in order from a lower side, a plurality of electrodes and a plurality of pads on the second metal film;
    removing a part of the second metal film by etching;
    removing the second insulating film by etching using, as a mask, the plurality of electrodes, the plurality of pads, and a remaining part of the second metal film; and
    forming a plurality of openings, each of which is in a position between a pair of electrodes in the plurality of electrodes, and is penetrating the substrate,
    wherein, when removing the part of the second metal film by etching, the second metal film is etched such that some part of the second metal film remains in a plurality of regions each connecting one of the plurality of electrodes and one of the plurality of pads, and
    when viewed from above the substrate, a region in which a whole of the plurality of openings having been formed except the plurality of openings themselves is configured by the plurality of electrodes, the plurality of pads, the first metal film, and the second metal film such that an insulating film is not exposed.

2. The method according to claim 1, wherein as material of the first metal film, the second metal film, the plurality of electrodes, and the plurality of pads, either gold (Au) or platinum (Pt) is used.

3. A blanking aperture array device for multi-beams comprising:
    a substrate where a plurality of openings are formed;
    a first metal film formed in a region, over an upper surface of the substrate, in which a whole of the plurality of openings has been formed except the plurality of openings themselves;
    a plurality of first electrodes, made of metal material and formed on the first metal film, each of which is close to a corresponding one of the plurality of openings;
    a plurality of second electrodes, made of metal material and formed on the first metal film, each of which is arranged at an opposite side of a corresponding one of the plurality of openings with respect to each of the plurality of first electrodes; and
    a plurality of wiring lines, made of metal material and formed on the first metal film, each of which is connected to either one of the plurality of first electrodes and the plurality of second electrodes,
    wherein the region in which the whole of the plurality of openings are formed except the plurality of openings themselves, over the upper surface of the substrate, and which faces a direction of irradiation of multi-charged particle beams, is covered with the first metal film, the plurality of first electrodes, the plurality of second electrodes, and the plurality of wiring lines.

* * * * *